United States Patent
Kim

(10) Patent No.: US 10,622,419 B2
(45) Date of Patent: Apr. 14, 2020

(54) ORGANIC LIGHT-EMITTING DISPLAY DEVICE HAVING AN ORGANIC INSULATING LAYER

(71) Applicant: LG Display Co., Ltd., Seoul (KR)

(72) Inventor: Min-Su Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/608,084

(22) Filed: May 30, 2017

(65) Prior Publication Data
US 2017/0345880 A1 Nov. 30, 2017

(30) Foreign Application Priority Data

May 31, 2016 (KR) .................. 10-2016-0067701
May 12, 2017 (KR) .................. 10-2017-0059469

(51) Int. Cl.
*H01L 27/32* (2006.01)
*H01L 51/52* (2006.01)

(52) U.S. Cl.
CPC ...... *H01L 27/3246* (2013.01); *H01L 51/5253* (2013.01)

(58) Field of Classification Search
CPC .................................................. H01L 27/3246
USPC .......................................................... 257/40
See application file for complete search history.

(56) References Cited

U.S. PATENT DOCUMENTS

| | | | |
|---|---|---|---|
| 2006/0033429 A1 | 2/2006 | Fujimura et al. | |
| 2007/0176548 A1* | 8/2007 | Kim ...................... | H01L 51/524 313/512 |
| 2010/0200846 A1* | 8/2010 | Kwack ................ | H01L 51/5253 257/40 |
| 2012/0104933 A1* | 5/2012 | Jung .................... | H01L 51/5246 313/498 |
| 2014/0183472 A1* | 7/2014 | Kim ..................... | H01L 27/3258 257/40 |
| 2014/0346445 A1* | 11/2014 | Cho ..................... | H01L 51/5246 257/40 |
| 2015/0060790 A1* | 3/2015 | Kim ..................... | H01L 51/5246 257/40 |
| 2015/0155522 A1 | 6/2015 | Kim | |

(Continued)

FOREIGN PATENT DOCUMENTS

| CN | 1735292 A | 2/2006 |
|---|---|---|
| CN | 104681733 A | 6/2015 |
| CN | 105609524 A | 5/2016 |

OTHER PUBLICATIONS

The First Office Action dated Aug. 28, 2018, from the State Intellectual Property Office of People's Republic of China in counterpart Chinese application No. 201710389652.2.

*Primary Examiner* — Igwe U Anya
(74) *Attorney, Agent, or Firm* — Morgan, Lewis & Bockius LLP

(57) ABSTRACT

An organic light-emitting display device includes an organic insulating layer such as an over-coat layer, a bank insulating layer and a capping layer. The organic insulating layer extends onto a non-display area of a lower substrate. The organic insulating layer is in contact with an encapsulating layer having a moisture-absorbing material on the non-display area of the lower substrate. Thus, the organic light-emitting display may block a path of permeating the moisture by the organic insulating layer.

17 Claims, 7 Drawing Sheets

(56) References Cited

U.S. PATENT DOCUMENTS

| | | | |
|---|---|---|---|
| 2015/0249117 A1* | 9/2015 | Choi | H01L 27/3246 |
| | | | 257/40 |
| 2015/0349293 A1* | 12/2015 | Park | H01L 51/5253 |
| | | | 257/40 |
| 2016/0126498 A1* | 5/2016 | Kim | H01L 51/5253 |
| | | | 257/40 |
| 2016/0155966 A1* | 6/2016 | Kim | H01L 51/0097 |
| | | | 257/40 |
| 2016/0164036 A1* | 6/2016 | Jung | H01L 51/5253 |
| | | | 257/40 |
| 2017/0170247 A1* | 6/2017 | Kim | H01L 27/3213 |
| 2017/0194397 A1* | 7/2017 | Kim | H01L 27/3251 |

* cited by examiner

ORGANIC LIGHT-EMITTING DISPLAY DEVICE HAVING AN ORGANIC INSULATING LAYER

This application claims the priority benefit of Korean Patent Application No. 10-2016-0067701, filed on May 31, 2016, and Korean Patent Application No. 10-2017-0059469, filed on May 12, 2017 which are hereby incorporated by reference as if fully set forth herein.

BACKGROUND

Technical Field

The present invention relates to an organic light-emitting display device, and more particularly to an organic light-emitting display device including at least one organic insulating layer for insulating between adjacent technical features.

Discussion of the Related Art

Generally, electronic appliances, such as a monitor, a TV, a laptop computer, and a digital camera, include a display device to realize an image. For example, the display device may include a liquid crystal display device and/or an organic light-emitting display device.

The organic light-emitting display device may include a plurality of pixel area. A light-emitting structure may be disposed on a corresponding pixel area. For example, the light-emitting structure may include a lower light-emitting electrode, a light-emitting layer, and an upper light-emitting electrode, which are sequentially stacked.

The light-emitting layer may be very vulnerable to moisture. Thereby, a method of manufacturing the organic light-emitting display device may include an encapsulation process in order to prevent the permeation of moisture from the outside. For example, the method of manufacturing the organic light-emitting display device may include a process of forming an upper protective layer including an inorganic material on the light-emitting structure, and a process of attaching an upper substrate to the lower substrate, on which the protective layer has been formed, using an encapsulating layer.

The organic light-emitting display device may include at least one organic insulating layer having an organic material. For example, a bank insulating layer including an organic material may be disposed between the lower light-emitting electrodes of the light-emitting structures disposed on adjacent pixel areas. The organic insulating layer may be formed by a deposition process using mask. A deposition shadow may occur by the deformation of the mask during the deposition process. For example, the organic insulating layer may include a tail region formed on outside of a display area on which the plurality of pixel area disposed. Therefore, the tail region of the organic insulating layer may be not completely covered by the upper protecting layer. In the organic light-emitting display device, the tail region of the organic insulating layer may serve as a path of permeating the moisture.

In addition, the thickness of the organic insulating layer may be relative thicker for high insulation. The step coverage of the upper protecting layer including inorganic material may be relative lower. As a result, an air bubble may occur in the thickness difference region by the organic light-emitting layer. In the organic light-emitting display device, the air bubble by the organic insulating layer may serve as a path of permeating the moisture.

SUMMARY

Accordingly, the present invention is directed to an organic light-emitting display device having an organic insulating layer that substantially obviates one or more problems due to limitations and disadvantages of the related art.

An object of the present invention is to provide an organic light-emitting display device, which may block a path of permeating the moisture by an organic insulating layer.

Another object of the present invention is to provide an organic light-emitting display device, which may prevent that an organic insulating layer extending a non-display area of a lower substrate serve as a path of permeating the moisture.

A further object of the present invention is to provide an organic light-emitting display device, which may prevent the generation of an air bubble by an organic insulating layer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these objects and other advantages and in accordance with the purpose of the invention, as embodied and broadly described herein, an organic light-emitting display device comprises a lower substrate. The lower substrate includes a display area and a non-display area. The non-display area is disposed outside the display area. A light-emitting structure is disposed on the display area of the lower substrate. The light-emitting structure includes a lower light-emitting electrode, a light-emitting layer and an upper light-emitting electrode, which are sequentially stacked. An edge of the lower light-emitting electrode is covered by a first region of a bank insulating layer. The bank insulating layer includes a second region overlapping the non-display area of the lower substrate. An encapsulating layer is disposed on the light-emitting structure and the bank insulating layer. The encapsulating layer includes a moisture-absorbing material. An upper substrate is disposed on the encapsulating layer. An upper surface of the second region of the bank insulating layer facing the upper substrate is in contact with the encapsulating layer.

A side surface of the bank insulating layer toward a side surface of the lower substrate may be vertically aligned with a side surface of the encapsulating layer.

A capping layer may be disposed between the light-emitting structure and the encapsulating layer. The capping layer may include an organic material. The encapsulating layer may be in contact with an upper surface of the capping layer facing the upper substrate.

A side surface of the capping layer toward the side surface of the lower substrate may be disposed on the display area of the lower substrate.

An over-coat layer may be disposed between the lower substrate and the light-emitting structure. The over-coat layer may include an organic material. The over-coat layer may extend between the non-display area of the lower substrate and the second region of the bank insulating layer.

A side surface of the over-coat layer toward the side surface of the lower substrate may be vertically aligned with the side surface of the encapsulating layer.

In another aspect, an organic light-emitting display device comprises a lower substrate. The lower substrate includes a display area and a non-display area. The non-display area is disposed outside the display area. An upper substrate is disposed on the display area and the non-display area of the lower substrate. An encapsulating layer is disposed between the lower substrate and the upper substrate. The encapsulating layer includes a moisture-absorbing material. A first organic insulating layer is disposed between the lower substrate and the encapsulating layer. The first organic insulating layer includes an organic material. An upper protecting layer is disposed between the first organic insulating layer and the encapsulating layer. The upper protecting layer includes an inorganic material. A side surface of the upper protecting layer toward a side surface of the lower substrate is disposed on the display area of the lower substrate.

The encapsulating layer may be in contact with the first organic insulating layer on the non-display area of the lower substrate.

A second organic insulating layer may be disposed between the display area of the lower substrate and the first organic insulating layer. The second organic insulating layer may extend between the non-display area of the lower substrate and the first organic insulating layer. The second organic insulating layer includes an organic material. The organic material of the second organic insulating layer may be different from the organic material of the first organic insulating layer.

A side surface of the second organic insulating layer may be continuous with a side surface of the first organic insulating layer.

A light-emitting structure may be disposed between the first organic insulating layer and the second organic insulating layer. The light-emitting structure may overlap the display area of the lower substrate. The light-emitting structure may include a lower light-emitting electrode, a light-emitting layer and an upper light-emitting electrode, which are sequentially stacked. The second organic insulating layer may cover an edge of the lower light-emitting electrode.

The first organic insulating layer may be in contact with an upper surface of the second organic insulating layer facing the upper substrate on the non-display area of the lower substrate.

A third organic insulating layer may be disposed between the lower substrate and the light-emitting structure. The third organic insulating layer may include an organic material. The third organic insulating layer may extend between the non-display area of the lower substrate and the second organic insulating layer.

The organic material of the third organic insulating layer may be different from the organic material of the second organic insulating layer.

A side surface of the third organic insulating layer may be continuous with the side surface of the second organic insulating layer on the non-display area of the lower substrate.

In accordance with further aspect of the present invention, there is provided an organic light-emitting display device including an upper substrate on a lower substrate. A light-emitting structure is disposed between the lower substrate and the upper substrate. The light-emitting structure includes a lower light-emitting electrode, a light-emitting layer and an upper light-emitting electrode, which are sequentially stacked. An upper protecting layer is disposed between the light-emitting structure and the upper substrate. The upper protecting layer includes an inorganic material. An over-coat layer is disposed between the lower substrate and the light-emitting structure. The over-coat layer extends to the outside of the upper protecting layer. An encapsulating layer is disposed between the upper protecting layer and the upper substrate. The encapsulating layer is in contact with the over-coat layer in the outside of the protecting layer. The encapsulating layer includes a moisture-absorbing material.

An edge of the lower light-emitting electrode may be covered by a bank insulating layer. The bank insulating layer may extend to the outside of the protecting layer. A side surface of the bank insulating layer may be disposed between a side surface of the over-coat layer and a side surface of the upper protecting layer in the outside of the upper protecting layer.

The encapsulating layer may be in contact with the side surface of the over-coat layer in the outside of the upper protecting layer.

A capping layer may be disposed between the light-emitting layer and the upper protecting layer. The capping layer may extend to the outside of the upper protecting layer. The capping layer may be in contact with the encapsulating layer in the outside of the upper protecting layer.

The side surface of the bank insulating layer may be disposed between the side surface of the over-coat layer and a side surface of the capping layer in the outside of the upper protecting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION

Figure 1:
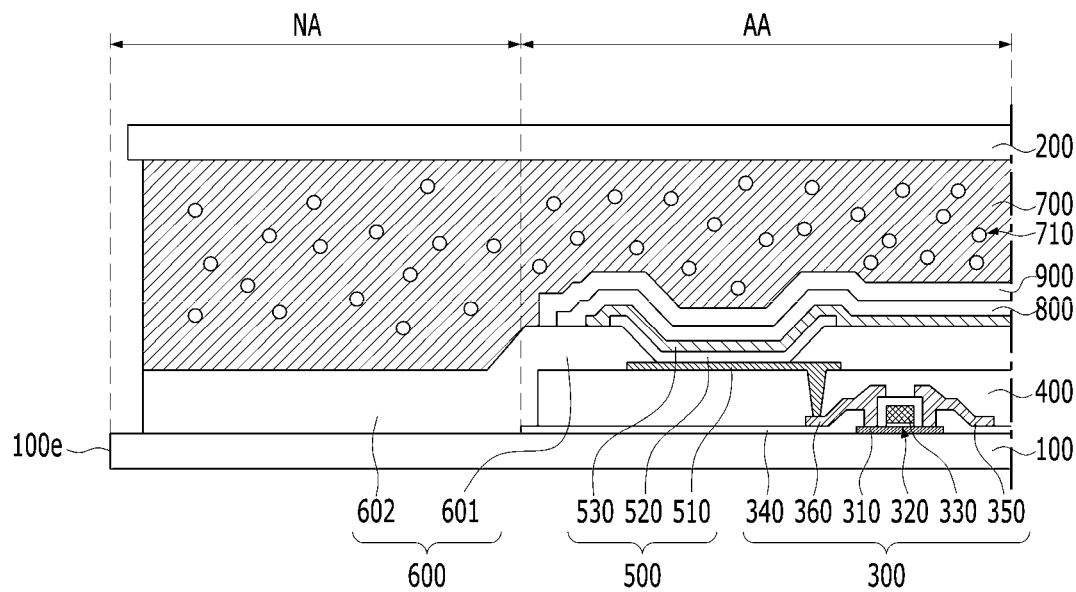
FIG. 1 is a view schematically showing an organic light-emitting display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

FIG. 1 is a view schematically showing an organic light-emitting display device according to an embodiment of the present invention.

Referring to FIG. 1, the organic light-emitting display device according to the embodiment of the present invention may include a lower substrate 100, an upper substrate 200, a thin-film transistor 300, an over coat layer 400, a light-emitting structure 500, a bank insulating layer 600 and an encapsulating layer 700.

The lower substrate 100 may support the thin-film transistor 300 and the light-emitting structure 500. The lower substrate 100 may include a display area AA and a non-display area NA. The non-display area NA may be disposed outside the display area AA. For example, the non-display area NA may be disposed close to a side surface 100e of the lower substrate 100.

The lower substrate 100 may include an insulating material. The lower substrate 100 may include a transparent material. For example, the lower substrate 100 may include glass or plastic.

The upper substrate 200 may be disposed on the lower substrate 100. For example, the upper substrate 200 may be disposed on the display area AA and the non-display area NA of the lower substrate 100. The size of the upper substrate 200 may be smaller than the size of the lower substrate 100. For example, a side surface of the upper substrate 200 may be disposed on the non-display area of the lower substrate 100.

The upper substrate 200 may include an insulating material. The upper substrate 200 may include a material differing from that of the lower substrate 100. The rigidity of the upper substrate 200 may be higher than that of the lower substrate 100. For example, the upper substrate 200 may include a metal, such as aluminum (Al) or copper (Cu).

The thin-film transistor 300 may be disposed between the lower substrate 100 and the upper substrate 200. For example, the thin-film transistor 300 may be disposed on the display area AA of the lower substrate 100.

The organic light-emitting display device according to the embodiment of the present invention is described that the thin-film transistor 300 is in contact with the lower substrate 100. However, an organic light-emitting display device according to another embodiment of the present invention may further include a buffer layer disposed between the lower substrate 100 and the thin-film transistor 300. The buffer layer may include an insulating material. For example, the buffer layer may include a silicon oxide or a silicon nitride.

The thin-film transistor 300 may include a semiconductor pattern 310, a gate insulating layer 320, a gate electrode 330, an interlayer insulating layer 340, a source electrode 350 and a drain electrode 360.

The semiconductor pattern 310 may include a semiconductor material. For example, the semiconductor pattern 310 may include amorphous silicon or polycrystalline silicon. The semiconductor pattern 310 may be oxide semiconductor. For example, the semiconductor pattern 310 may include IGZO.

The semiconductor pattern 310 may include a source area, a drain area and a channel area. The channel area may be disposed between the source area and the drain area. The conductivity of the channel area may be lower than that of the source area and that of the drain area. For example, the source area and the drain area may include a conductive impurity.

The gate insulating layer 320 may be disposed on the semiconductor pattern 310. The size of the gate insulating layer 320 may be smaller than that of the semiconductor pattern 310. For example, the gate insulating layer 320 may overlap the channel area of the semiconductor pattern 310.

The gate insulating layer 320 may include an insulating material. For example, the gate insulating layer 320 may include silicon oxide and/or silicon nitride. The gate insulating layer 320 may include High-K material. For example, the gate insulating layer 320 may include hafnium oxide (HfO) or titanium oxide (TiO). The gate insulating layer 320 may be a multi-layer structure.

The gate electrode 330 may be disposed on the gate insulating layer 320. The gate insulating layer 320 may insulate the gate electrode 330 from the semiconductor pattern 310. The gate electrode 330 may overlap the channel area of the semiconductor pattern 310. For example, a side surface of the gate insulating layer 320 may be vertically aligned with a side surface of the gate electrode 330. The gate insulating layer 320 may include a side surface which is continuous with the side surface of the gate electrode 330.

The gate electrode 330 may include a conductive material. For example, the gate electrode 330 may include a metal, such as aluminum (Al), chromium (Cr), molybdenum (Mo), and tungsten (W).

The interlayer insulating layer 340 may be disposed on the semiconductor pattern 310 and the gate electrode 330. The interlayer insulating layer 340 may extend to the outside of the semiconductor pattern 310. A side surface of the semiconductor pattern 310 may be covered by the interlayer insulating layer 340. For example, a side surface of the interlayer insulating layer 340 toward the side surface 100e of the lower substrate 100 may be vertically aligned with a boundary between the display area AA and the non-display area NA of the lower substrate 100.

The interlayer insulating layer 340 may include an insulating material. For example, the interlayer insulating layer 340 may include silicon oxide and/or silicon nitride. The interlayer insulating layer 340 may be a multi-layer structure.

The source electrode 350 may be disposed on the interlayer insulating layer 340. For example, the source electrode 350 may vertically overlap the source area of the semiconductor pattern 310. The source electrode 350 may be electrically connected to the source area of the semiconductor pattern 310. For example, the interlayer insulating layer 340 may include a contact hole exposing the source area of the semiconductor pattern 310.

The source electrode 350 may include a conductive material. For example, the source electrode 350 may include a metal, such as aluminum (Al), chromium (Cr), molybdenum (Mo), and tungsten (W). The source electrode 350 may include a material different from that of the gate electrode 330.

The drain electrode 360 may be disposed on the interlayer insulating layer 340. For example, the drain electrode 360 may vertically overlap the drain area of the semiconductor pattern 310. The drain electrode 360 may be separated from the source electrode 350. The drain electrode 360 may be electrically connected to the drain area of the semiconductor pattern 310. For example, the interlayer insulating layer 340 may include a contact hole exposing the drain area of the semiconductor pattern 310.

The drain electrode 360 may include a conductive material. For example, the drain electrode 360 may include a metal, such as aluminum (Al), chromium (Cr), molybdenum (Mo), and tungsten (W). The drain electrode 360 may include a material different from that of the gate electrode 330. For example, the drain electrode 360 may include the same material as the source electrode 350.

The organic light-emitting display device according to the embodiment of the present invention is described that the semiconductor pattern 310 of the thin-film transistor 300 is disposed close to the lower substrate 100. However, the organic light-emitting display device according to another embodiment of the present invention may include the thin-film transistor 300 in which the semiconductor layer 310 is disposed between the gate electrode 330 and the source electrode 350, and between the gate electrode 330 and the drain electrode 360.

The over-coat layer 400 may disposed on the thin-film transistor 300. The over-coat layer 400 may remove thickness difference by the thin-film transistor 300. For example, an upper surface of the over-coat layer 400 facing the upper substrate 200 may be flat surface. The upper surface of the over-coat layer 400 may be parallel to a surface of the lower substrate 100.

The over-coat layer 400 may extend along the interlayer insulating layer 340. For example, a side surface of the over-coat layer 400 toward the side surface 100e of the lower substrate 100 may be disposed close to the boundary between the display area AA and the non-display area NA of the lower substrate 100.

The over-coat layer 400 may include an insulating material. For example, the over-coat layer 400 may be an organic insulating layer including an organic material.

The organic light-emitting display device according to the embodiment of the present invention is described that the over-coat layer 400 is in contact with the thin-film transistor 300. However, the organic light-emitting display device according to another embodiment of the present invention may include a lower protecting layer between the thin-film transistor 300 and the over-coat layer 400. The lower protecting layer may include an inorganic material. The lower protecting layer may a multi-layer structure.

The light-emitting structure 500 may generate light for realizing a particular color. For example, the light-emitting structure 500 may include a lower light-emitting electrode 510, a light-emitting layer 520, and an upper light-emitting electrode 530, which are sequentially stacked. The light-emitting structure 500 may be disposed on the over-coat layer 400. The light-emitting structure 500 may be controlled by the thin-film transistor 300. For example, the lower light-emitting electrode 510 of the light-emitting structure 500 may be electrically connected to the drain electrode 360 of the thin-film transistor 300. The over-coat layer 400 may include a contact hole exposing the drain electrode 360 of the thin-film transistor 300.

The lower light-emitting electrode 510 may include a conductive material. The lower light-emitting electrode 510 may include a transparent material. For example, the lower light-emitting electrode 510 may include ITO or IZO.

The light-emitting layer 520 may generate light, the brightness of which corresponds to the voltage difference between the lower light-emitting electrode 510 and the upper light-emitting electrode 530. The light generated by the light-emitting layer 520 may realize a particular color. For example, the light generated by the light-emitting layer 520 may be realized as one of red, green, blue, and white. The light-emitting structure 500 may realize a color different from a color realized by the light-emitting structure 500 disposed on the adjacent pixel area. For example, the light-emitting layer 520 may be separated from the light-emitting layer 520 disposed on the adjacent pixel area.

The light-emitting layer 520 may include an emission material layer (EML) having an emission material. The emission material may be an organic material. The light-emitting layer 520 may be a multi-layer structure in order to increase luminous efficacy. For example, the light-emitting layer 520 may further include at least one of a hole injection layer (HIL), a hole transporting layer (HTL), an electron transporting layer (ETL), and an electron injection layer (EIL).

The upper light-emitting electrode 530 may include a conductive material. The upper light-emitting electrode 530 may include a material different from that of the lower light-emitting electrode 510. For example, the upper light-emitting electrode 530 may include a metal, such as aluminum (Al). The reflectivity of the upper light-emitting structure 530 may be higher than that of the lower light-emitting structure 510.

The organic light-emitting display device according to the embodiment of the present invention is described that the upper substrate 200 and the upper light-emitting electrode 530 include a metal. However, the organic light-emitting display device according to another embodiment of the present invention may emit a light generated by the light-emitting structure 500 toward the upper substrate 200. For example, the organic light-emitting display device according to another embodiment of the present invention may include the upper substrate 200 and the upper light-emitting electrode 530 having a transparent material.

The bank insulating layer 600 may insulate between the light-emitting structures 500 disposed on the adjacent pixel areas. For example, the bank insulating layer 600 may cover an edge of the lower light-emitting electrode 510. A side surface of the light-emitting layer 520 may be disposed on the bank insulating layer 600 in each pixel area. The upper light-emitting electrode 530 may extend onto the light-emitting layer 520 and the bank insulating layer 600.

The bank insulating layer 600 may extend onto the non-display area NA of the lower substrate 100. For example, the bank insulating layer 600 may include a first region 601 covering the edge of the lower light-emitting electrode 510, and a second region 602 vertically overlapping the non-display area NA of the lower substrate 100. The side surface of the interlayer insulating layer 340 and the side surface of the over-coat layer 400 toward the side surface 100e of the lower substrate 100 may be in contact with the bank insulating layer 600.

The bank insulating layer 600 may include an insulating material. For example, the bank insulating layer 600 may be an organic insulating layer including an organic material. The organic material of the bank insulating layer 600 may be different from the organic material of the over-coat layer 400. For example, the bank insulating layer 600 may include one of benzo cyclo-butene (BCB), poly-imide (PI), and photo-acryl.

In the organic light-emitting display device according to the embodiment of the present invention, the bank insulating layer 600, which is an organic insulating layer, may extend onto the non-display area NA of the lower substrate 100. Therefore, in the organic light-emitting display device according to the embodiment of the present invention, thickness difference by the organic insulating layer may be decreased substantially. As a result, in the organic light-emitting display device according to the embodiment of the present invention, an air bubble may not occur in the thickness difference region by the organic insulating layer.

The encapsulating layer 700 may be disposed between the light-emitting structure 500 and the upper substrate 200. The encapsulating layer 700 may extend onto the non-display area NA of the lower substrate 100. For example, the encapsulating layer 700 may extend between the second region 602 of the bank insulating layer 600 and the upper substrate 200. The light-emitting structure 500 may be surrounded by the encapsulating layer 700.

The encapsulating layer 700 may include an adhesive material. The upper substrate 200 may be in contact with the encapsulating layer 700. For example, the upper substrate 200 may be coupled with the lower substrate 100, on which the light-emitting structure 500 and the bank insulating layer 600 has been formed.

The size of the encapsulating layer 700 may be smaller than the size of the upper substrate 200. For example, the side surface of the upper substrate 200 may be disposed between the side surface 100e of the lower substrate 100 and a side surface of the encapsulating layer 700. The side surface of the bank insulating layer 600 toward the side surface 100e of the lower substrate 100 may be vertically aligned with the side surface of the encapsulating layer 700. The bank insulating layer 600 may include a side surface being continuous with the side surface of the encapsulating layer 700.

The encapsulating layer 700 may be in contact with the bank insulating layer 600 on the non-display area NA of the lower substrate 100. For example, an upper surface of the second region 602 of the bank insulating layer 600 facing the upper substrate may be in contact with the encapsulating layer 700. The encapsulating layer 700 may include a moisture-absorbing material 710. Thus, in the organic light-emitting display device according to the embodiment of the present invention, the moisture permeating though the second region 602 of the bank insulating layer 600 may be collected by the moisture-absorbing material 710 of the encapsulating layer 700. As a result, the organic light-emitting display device according to the embodiment of the present invention may prevent that the bank insulating layer 600 extending onto the non-display area NA of the lower substrate 100 serves as a path of permeating the moisture.

The moisture collecting efficiency of the encapsulating layer 700 may be higher than the moisture permeating efficiency of the bank insulating layer 600. Therefore, in the organic light-emitting display device according to the embodiment of the present invention, the path of permeating the moisture by the bank insulating layer 600 may be effectively blocked.

The moisture-absorbing material 710 may include a metal compound, such as alumina, a metal oxide, a metal salt or a mixture thereof. For example, the moisture-absorbing material 710 may include lithium oxide (LiO), sodium oxide (NaO), barium oxide (BaO), calcium oxide (CaO) or magnesium oxide (MgO). For example, the moisture-absorbing material 710 may include a sulfate salt, such as lithium sulfate (LiSO), sodium sulfate (NaSO), calcium sulfate (CaSO), magnesium sulfate (MgSO), cobalt sulfate (CoSO), gallium sulfate (GaSO), titanium sulfate (TiSO), nickel sulfate (NiSO), a metal halide, such as calcium chloride (CaCl), magnesium chloride (MgCl), strontium chloride (SrCl), chloride yttrium (YCl), copper chloride (CuCl), cesium fluoride (CsF), fluoride tantalum (TaF), fluoride niobium (NbF), lithium bromide (LiBr), calcium bromide (CaBr), cesium bromide (CeBr), selenium bromide (SeBr), vanadium bromide (VBr), magnesium bromide (MgBr), barium iodide (BaI), magnesium iodide (MgI), and a metal chlorate, such as barium perchlorate (BaClO), magnesium perchlorate (MgClO).

The organic light-emitting display device according to the embodiment of the present invention may further include a capping layer 800 between the light-emitting structure 500 and the encapsulating layer 700, and an upper protecting layer 900 between the capping layer 800 and the encapsulating layer 700. The capping layer 800 and the upper protecting layer 900 may prevent a damage of the light-emitting structure 500 by the moisture and the particles. The upper protecting layer 900 may include a material different from that of the capping layer 800. For example, the capping layer 800 may be an organic insulating layer including an organic material. The upper protecting layer 900 may be an inorganic insulating layer having an inorganic material. The capping layer 800 may be covered by the upper protecting layer 900. For example, a side surface of the capping layer 800 may be in contact with the upper protecting layer 900.

Figure 2:
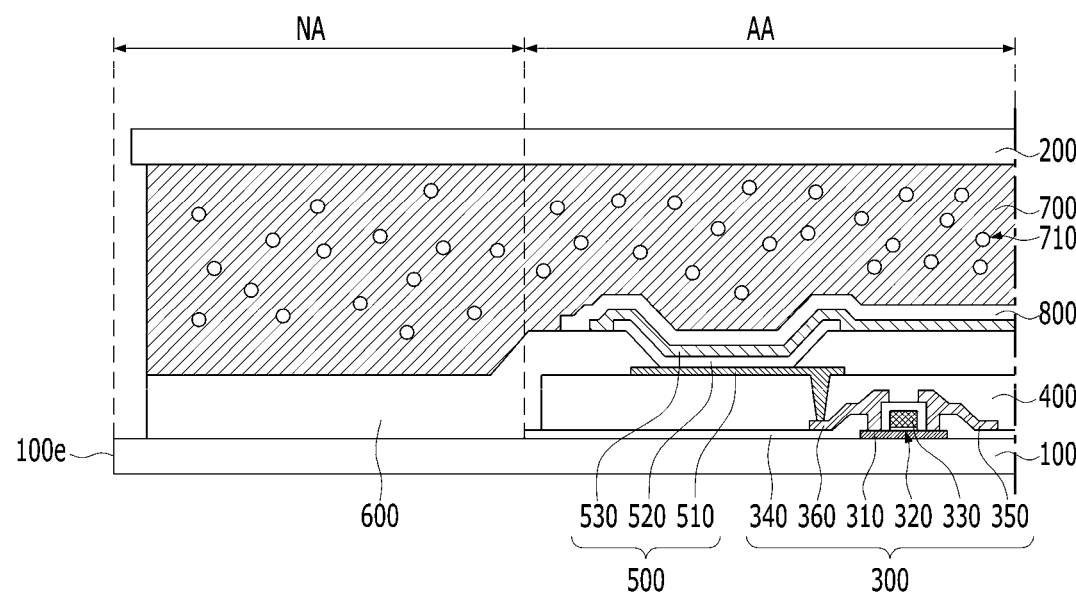
FIGS. 2 to 14 are views respectively showing various examples of an organic light-emitting display device according to another embodiment of the present invention.

The organic light-emitting display device according to the embodiment of the present invention is described that the upper protecting layer 900 including an inorganic material is disposed between the capping layer 800 having an organic material and the encapsulating layer 700 having an organic material. However, as shown in FIG. 2, in the organic light-emitting display device according to another embodiment of the present invention, an upper surface of the capping layer 800 facing the upper substrate 200 may be in directly contact with the encapsulating layer 700. Thus, in the organic light-emitting display device according to another embodiment of the present invention, a path of permeating the moisture by an organic insulating layer may be blocked without a process of forming the upper protecting layer 900. As a result, in the organic light-emitting display device according to another embodiment of the present invention, the life-time, the reliability and the manufacturing efficiency may be increased.

Figure 3:
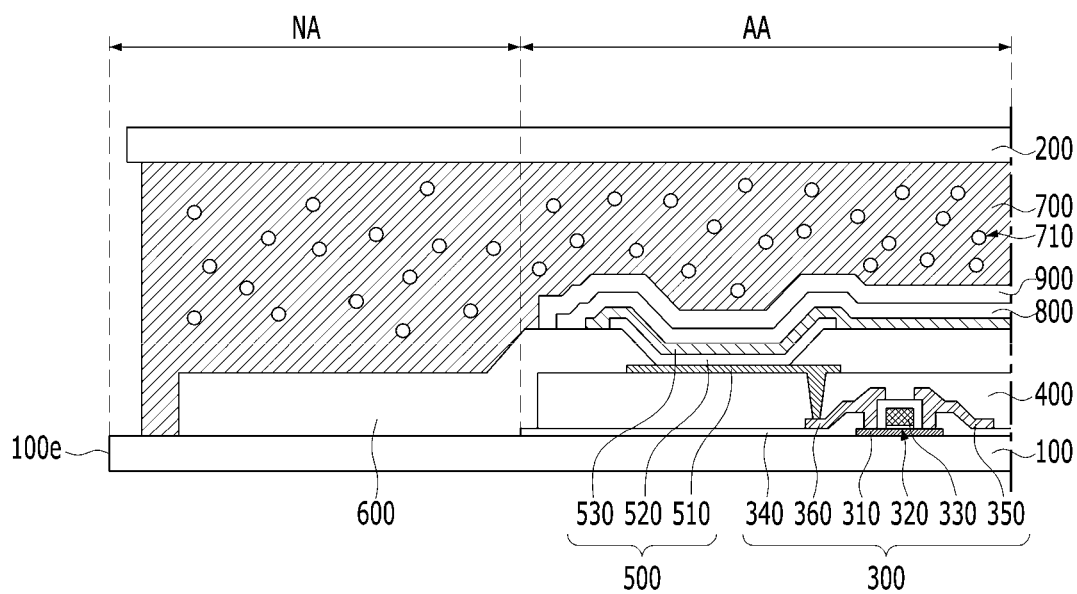
Figure 4:
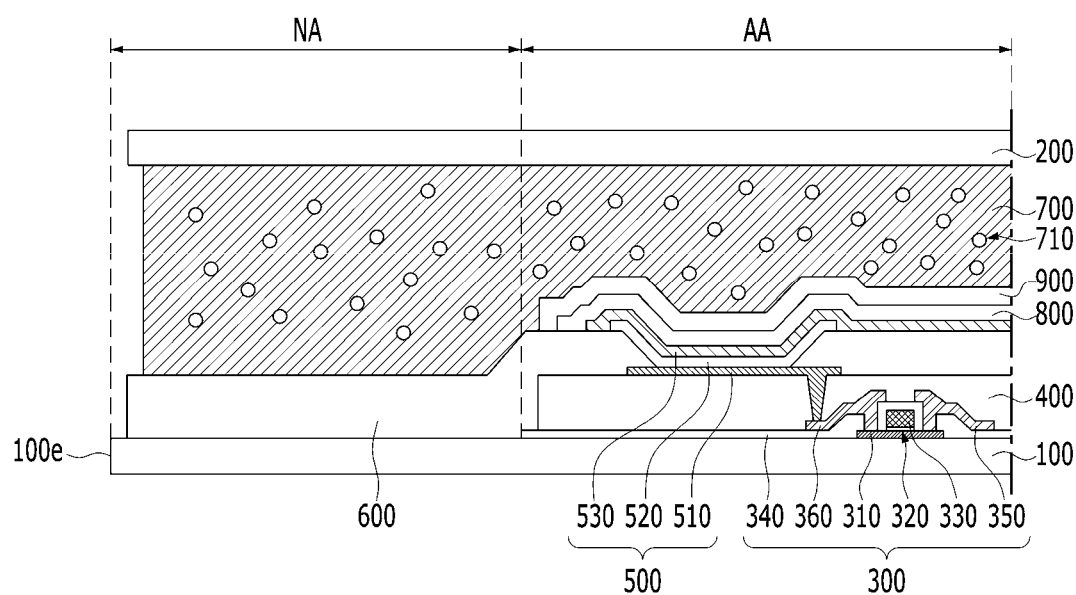

The organic light-emitting display device according to the embodiment of the present invention is described that the side surface of the bank insulating layer toward the side surface 100e of the lower substrate 100 is vertically aligned with the side surface of the encapsulating layer 700. However, in the organic light-emitting display device according to another embodiment of the present invention, the side surface of the encapsulating layer 700 may be not continuous with the side surface of the bank insulating layer 600 on the non-display area NA of the lower substrate 100. For example, as shown in FIG. 3, in the organic light-emitting display device according to another embodiment of the present invention, the side surface of the bank insulating layer 600 toward the side surface 100e of the lower substrate 100 may be covered by the encapsulating layer 700. For example, as shown in FIG. 4, in the organic light-emitting display device according to another embodiment of the present invention, the bank insulating layer 600 may include a side surface which is disposed between the side surface 100e of the lower substrate 100 and the side surface of the encapsulating layer 700. Thus, in the organic light-emitting display device according to another embodiment of the present invention, the process margin of the encapsulation process may be increased.

Figure 5:
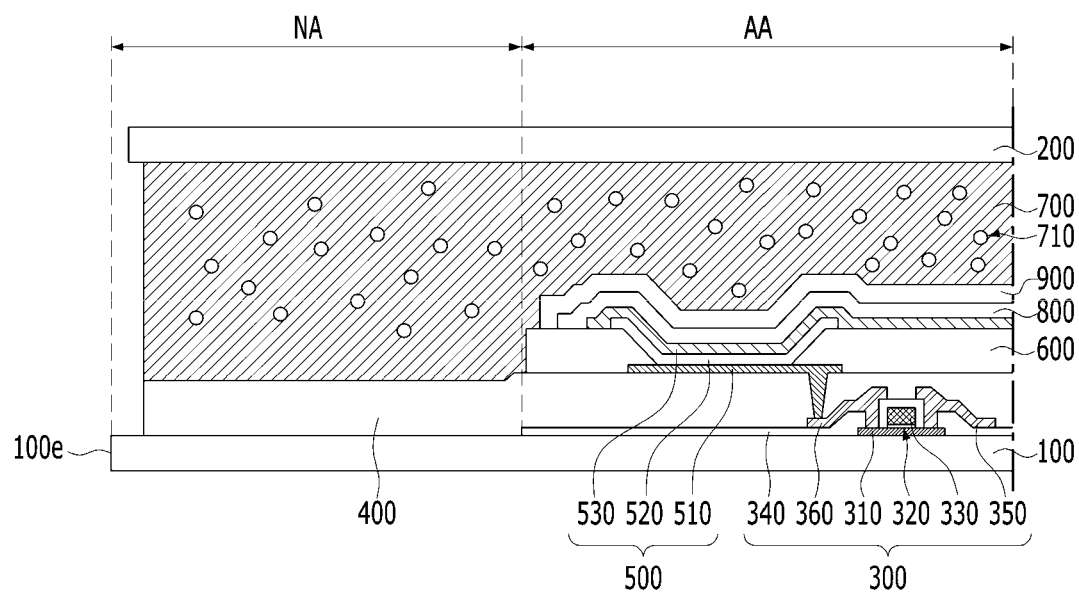
Figure 6:
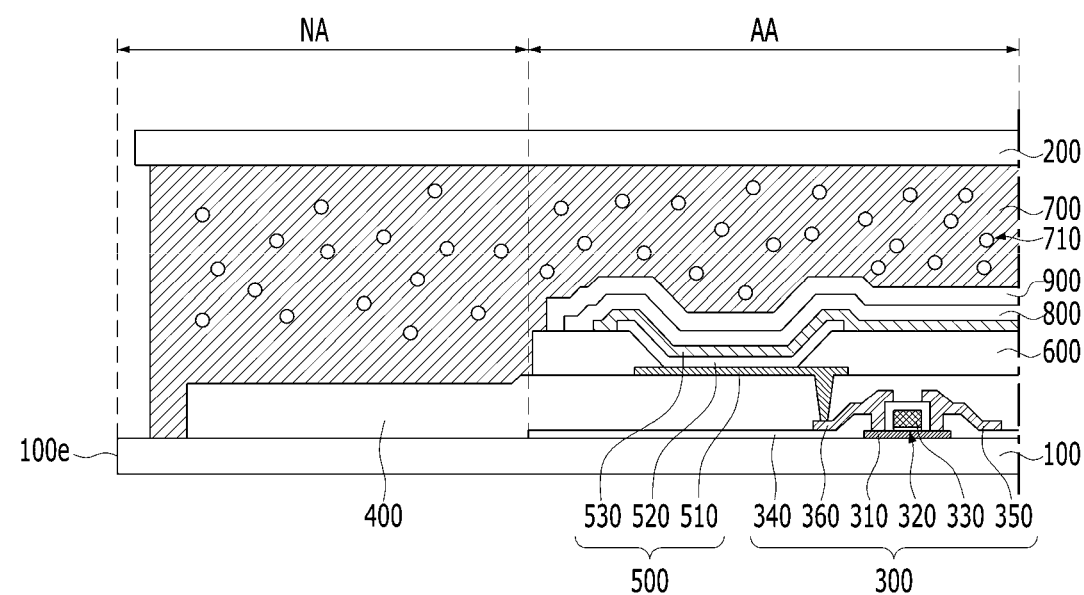

The organic light-emitting display device according to the embodiment of the present invention is described that the bank insulating layer 600 is in contact with the encapsulating layer 700 on the non-display area NA of the lower substrate 100. However, as shown in FIGS. 5 and 6, in the organic light-emitting display device according to another embodiment of the present invention, the over-coat layer 400 may be in contact with the encapsulating layer 700 on the non-display area NA of the lower substrate 100. The over-coat layer 400 may include an organic material. The encapsulating layer 700 may include a moisture-absorbing material. For example, as shown in FIG. 5, in the organic light-emitting display device according to another embodiment of the present invention, the side surface of the over-coat layer 400 toward the side surface 100e of the lower substrate 100 may be vertically aligned with the side surface of the encapsulating layer 700. For example, as shown in FIG. 6, in the organic light-emitting display device according to another embodiment of the present invention, the side surface of the over-coat layer 400 toward the side surface 100e of the lower substrate 100 may be covered by the encapsulating layer 700. As a result, in the organic light-emitting display device according to another embodiment of the present invention, a path of permeating the moisture by an organic insulating layer may be efficiently blocked.

Figure 7:
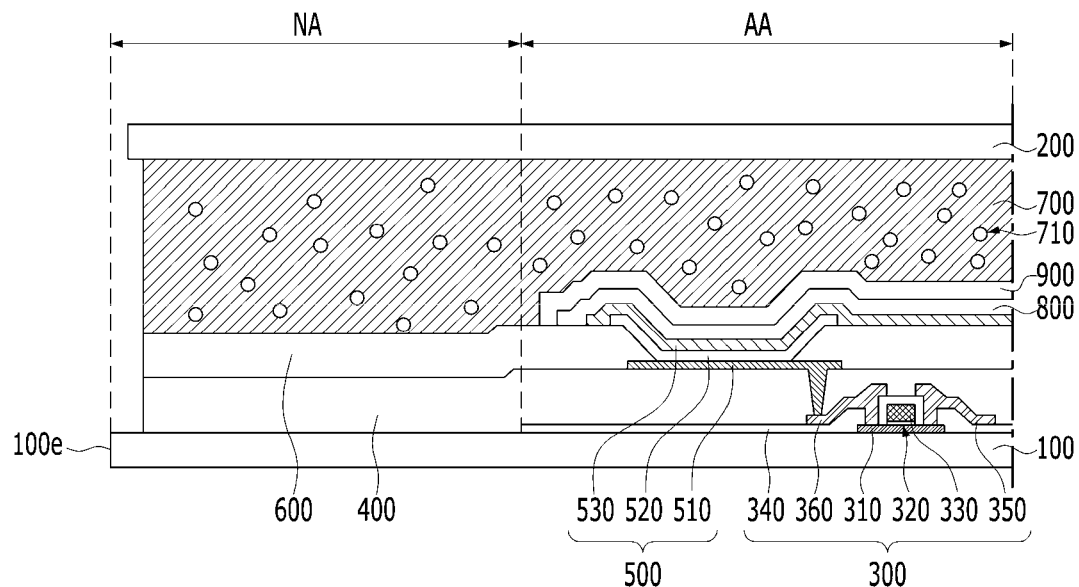
Figure 8:
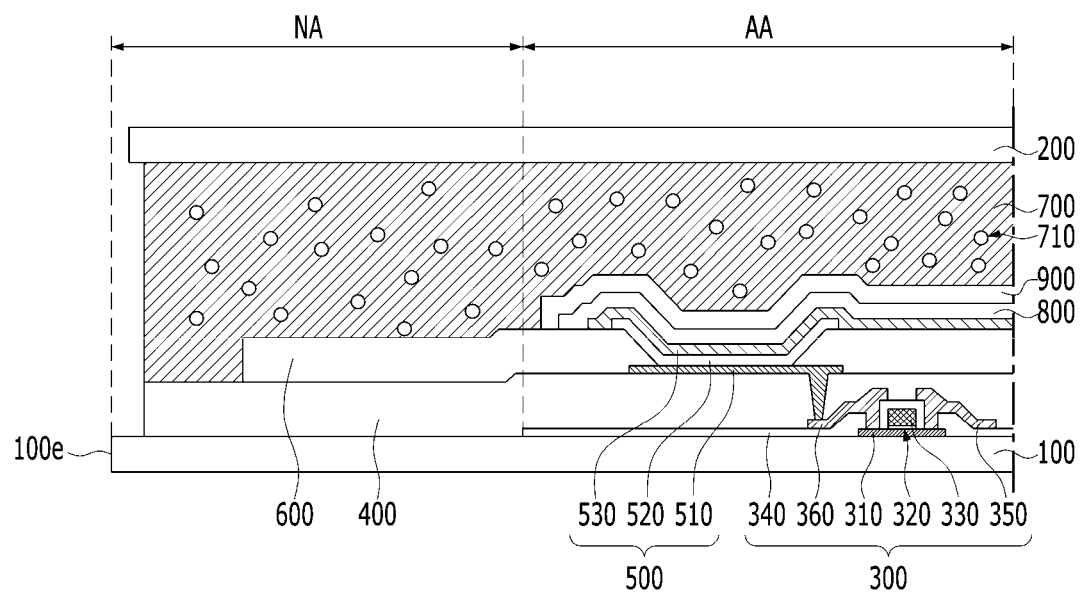

The organic light-emitting display device according to the embodiment of the present invention is described that only the bank insulating layer 600 extends onto the non-display area NA of the lower substrate 100. However, as shown in FIGS. 7 and 8, in the organic light-emitting display device according to another embodiment of the present invention, the over-coat layer 400 and the bank insulating layer 600 may extend onto the non-display area NA of the lower substrate 100. The side surface of the over-coat layer 400 toward the side surface 100e of the lower substrate 100 may be vertically aligned with the side surface of the encapsulating layer 700. For example, as shown in FIG. 7, in the organic light-emitting display device according to another embodiment of the present invention, the side surface of the bank insulating layer 600 toward the side surface 100e of the lower substrate 100 may be the side surface of the over-coat layer 400 toward the side surface 100e of the lower substrate 100. For example, as shown in FIG. 8, in the organic light-emitting display device according to another embodiment of the present invention, the side surface of the bank insulating layer 600 toward the side surface 100e of the lower substrate 100 may be covered by the encapsulating layer 700. As a result, in the organic light-emitting display device according to another embodiment of the present invention, the generation of the air bubble by the over-coat layer 400 and the bank insulating layer 600 may be efficiently prevented.

Figure 9:
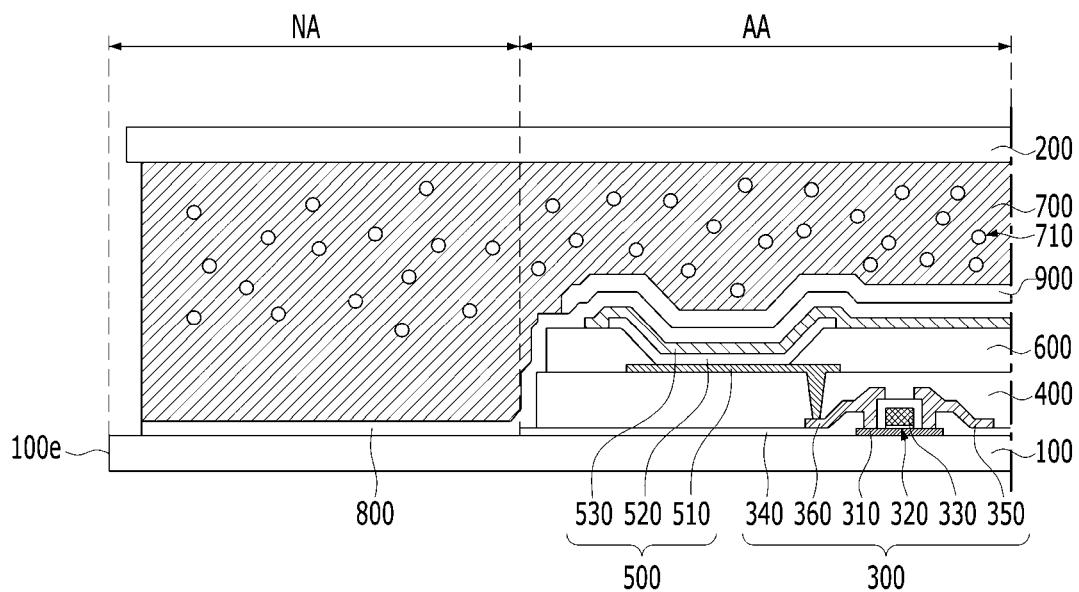

The organic light-emitting display device according to the embodiments of the present invention is described that the bank insulating layer 600 and/or the over-coat layer 400 extends onto the non-display area NA of the lower substrate 100. However, the organic light-emitting display device according to another embodiment of the present invention may include a capping layer 800 which is in directly contact with the encapsulating layer 700 in the outside of the upper protecting layer 900. For example, as shown in FIG. 9, the organic light-emitting display device according to another embodiment of the present invention includes a capping layer 800 being in directly contact with the lower substrate 100 and the encapsulating layer 700 in the outside of the upper protecting layer 900. Thus, in the organic light-emitting display device according to another embodiment of the present invention, the generation of the air bubble by the thickness difference of the organic insulating layer may be prevented, and a path of permeating the moisture by the organic insulating layer may be blocked.

Figure 10:
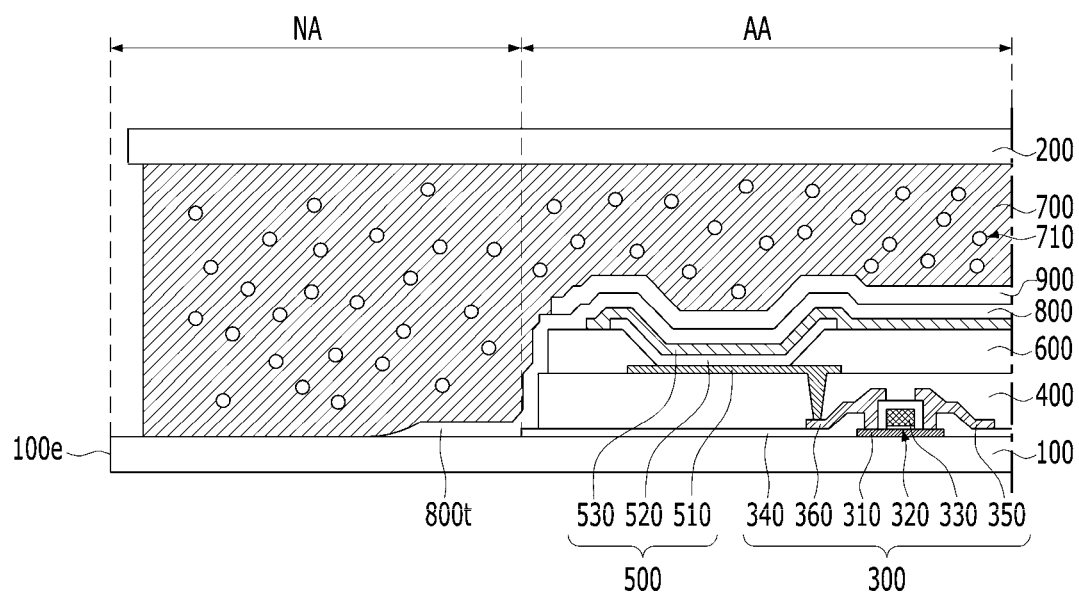

The organic light-emitting display device according to another embodiment of the present invention is described that a side surface of the capping layer 800 toward the side surface 100e of the lower substrate 100 is continuous with the side surface of the encapsulating layer 700. However, the organic light-emitting display device according to the further another embodiment of the present invention may include an encapsulating layer 700 which is contact with the lower substrate 100 in the outside of the capping layer 800. For example, as shown in FIG. 10, in the organic light-emitting display device according to the further another embodiment of the present invention, the capping layer 800 may include a tail region 800t disposed on the non-display area NA of the lower substrate 100. Thus, in the organic light-emitting display device according to the further another embodiment of the present invention, the capping layer 800 may be formed by a conventional process. As a result, in the organic light-emitting display device according to the further another embodiment of the present invention, the degree of freedom in forming the capping layer 800 may be improved.

Figure 11:
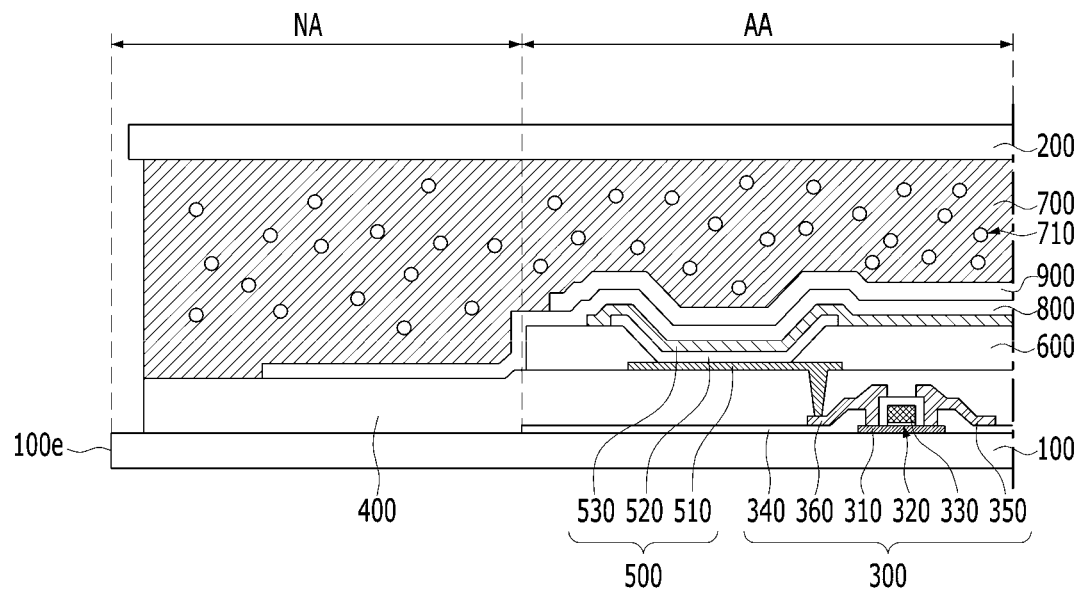
Figure 12:
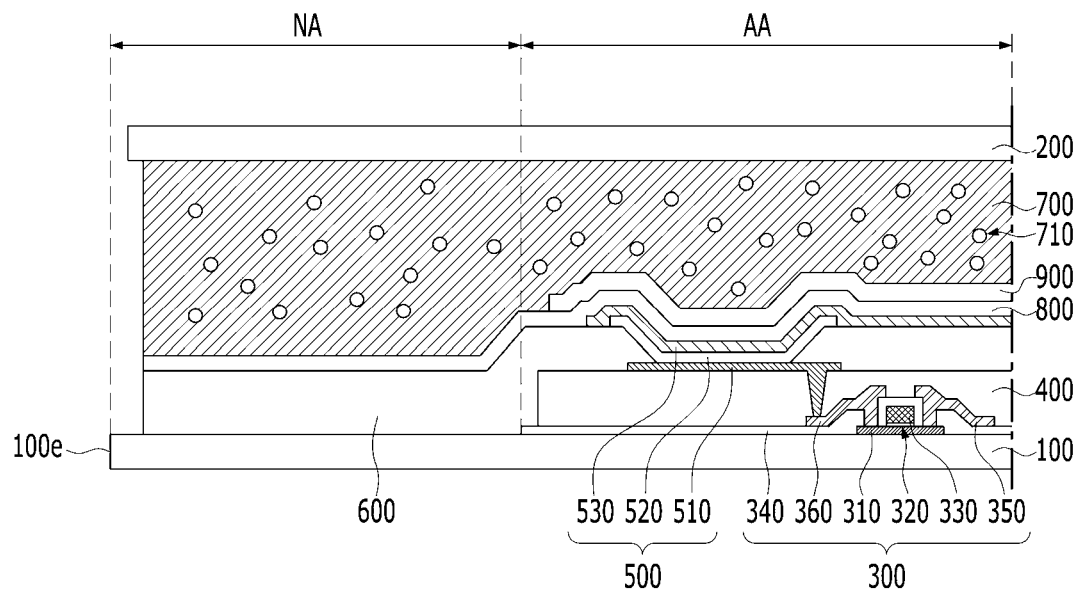

The organic light-emitting display device according to another embodiment of the present invention is described that the capping layer 800 is in contact with the non-display area NA of the lower substrate 100. However, the organic light-emitting display device according to the further another embodiment of the present invention may include an organic insulating layer extending between the non-display area NA of the lower substrate 100 and the capping layer 800. For example, as shown in FIG. 11, in the organic light-emitting display device according to the further another embodiment of the present invention, the side surface of the over-coat layer 400 toward the side surface 100e of the lower substrate 100 may be vertically aligned with the side surface of the encapsulating layer 700. The over-coat layer 400 may be in contact with the encapsulating layer 700. For example, the encapsulating layer 700 may cover the side surface of the over-coat layer 400 toward the side surface 100e of the lower substrate 100. For example, as shown in FIG. 12, in the organic light-emitting display device according to the further another embodiment of the present invention, the bank insulating layer 600 may extend onto the non-display area NA of the lower substrate 100. As a result, in the organic light-emitting display device according to the further another embodiment of the present invention, the generation of the air bubble by the thickness difference of the organic insulating layer may be efficiently prevented.

Figure 13:
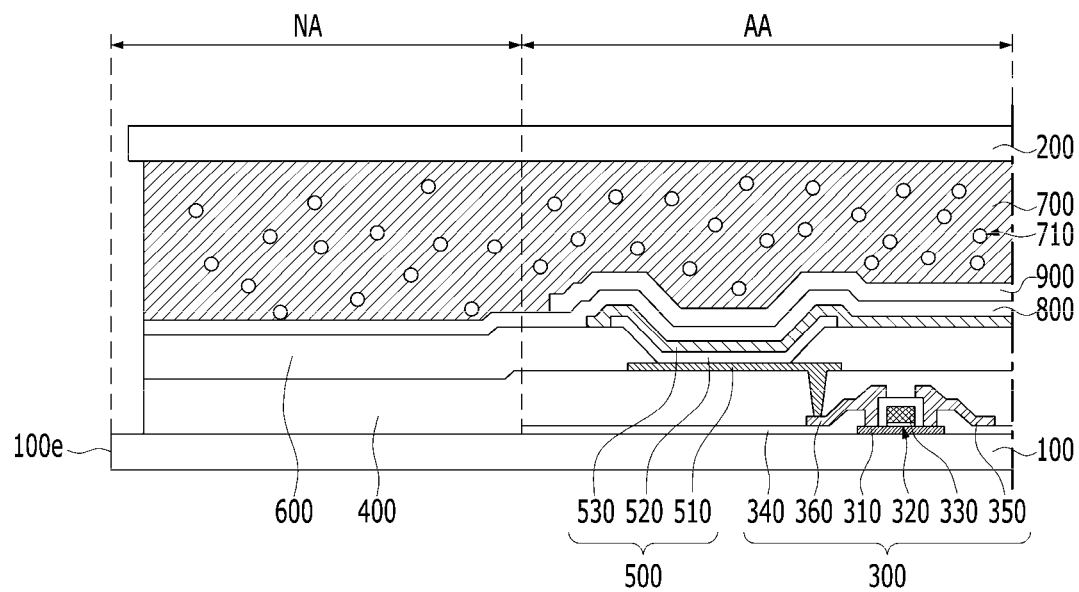
Figure 14:
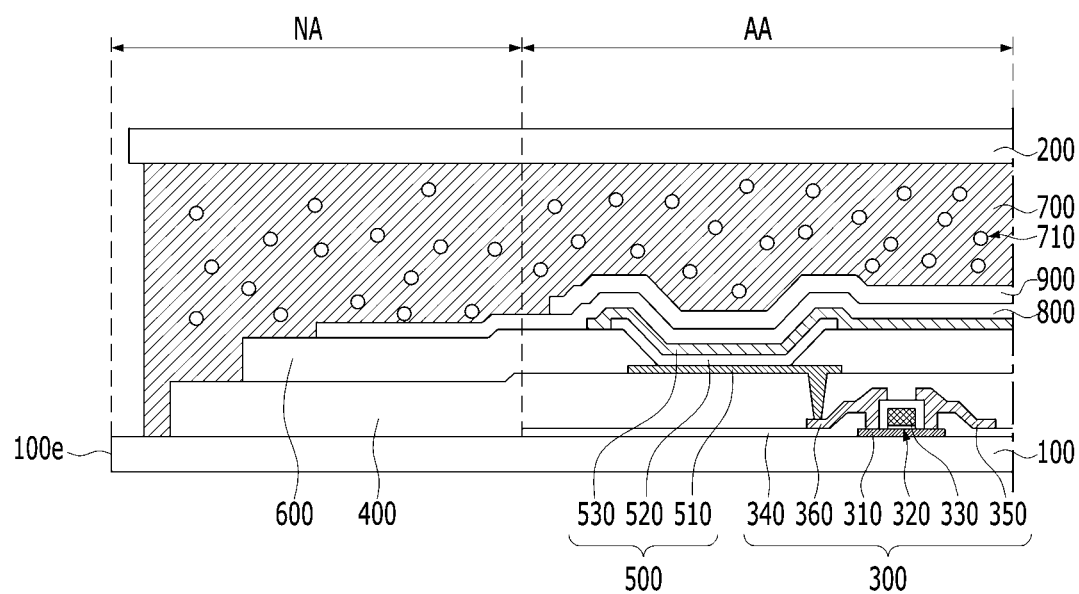

The organic light-emitting display device according to the embodiments of the present invention is described that some organic insulating layer extends onto the non-display area NA of the lower substrate 100. However, in the organic light-emitting display device according to another embodiment of the present invention, all organic insulating layers may extend onto the non-display area NA of the lower substrate 100. For example, as shown in FIG. 13, in the organic light-emitting display device according to another embodiment of the present invention, the over-coat layer 400, the bank insulating layer 600, and the capping layer 800 may respectively include a side surface which is vertically aligned with the side surface of the encapsulating layer 700. For example, as shown in FIG. 14, in the organic light-emitting display device according to further another embodiment of the present invention, the over-coat layer 400, the bank insulating layer 600, and the capping layer 800 may be step-shape on the non-display area NA of the lower substrate 100. Thus, in the organic light-emitting display device according to further another embodiment of the present invention, the over-coat layer 400, the bank insulating layer 600, and the capping layer 800 may be in contact with the encapsulating layer 700 on the non-display area NA of the lower substrate 100. As a result, in the organic light-emitting display device according to embodiments of the present invention, a path of permeating the moisture by the organic insulating layer may be efficiently blocked.

Accordingly, in the organic light-emitting display device according to embodiments of the present invention, at least one among the organic insulating layers, such as the over-coat layer 400, the bank insulating layer 600, and the capping layer 800, extends onto the non-display area NA of the lower substrate 100, and is contact with the encapsulating layer having a moisture-absorbing material on the non-display area NA of the lower substrate 100. Thus, in the organic light-emitting display device according to embodiments of the present invention, the thickness difference by the thickness of the organic insulating layer may be decrease, and the moisture permeating though the organic insulating layer which extends onto the non-display area NA of the lower substrate 100 may be blocked. As a result, in the organic light-emitting display device according to embodiments of the present invention, the life-time and the reliability are increased.

The organic light-emitting display device in accordance with the embodiments of the present invention may block a path of permeating the moisture using an encapsulating layer having a moisture-absorbing material. Therefore, a damage of a light-emitting structure by the moisture permeating from the outside may be minimized in the organic light-emitting display device in accordance with the embodiments of the present invention. Thus, in the organic light-emitting display device in accordance with the embodiments of the present invention, the life-time and the reliability are improved.

It will be apparent to those skilled in the art that various modifications and variations can be made in the organic light-emitting display device having an organic insulating layer of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display device, comprising:
a lower substrate including a display area and a non-display area disposed outside the display area, the non-display area including a side surface of the lower substrate;
a light-emitting structure on the display area of the lower substrate, the light-emitting structure including a lower light-emitting electrode, a light-emitting layer and an upper light-emitting electrode, which are sequentially stacked;
a bank insulating layer including a first region covering an edge of the lower light-emitting electrode, and a second region overlapping the non-display area of the lower substrate;
an encapsulating layer on the light-emitting structure and the bank insulating layer, the encapsulating layer including a moisture-absorbing material; and
an upper substrate on the encapsulating layer,
wherein an upper surface of the second region of the bank insulating layer facing the upper substrate is in contact with the encapsulating layer,
wherein a side surface of the bank insulating layer toward the side surface of the lower substrate is between the side surface of the lower substrate and the light-emitting structure, and
wherein the side surface of the bank insulating layer toward the side surface of the lower substrate is vertically aligned with a side surface of the encapsulating layer.

2. The organic light-emitting display device according to claim 1, further comprising a capping layer between the light-emitting structure and the encapsulating layer,
wherein the capping layer includes an organic material, and the encapsulating layer is in contact with an upper surface of the capping layer facing the upper substrate.

3. The organic light-emitting display device according to claim 2, wherein a side surface of the capping layer toward a side surface of the lower substrate is disposed on the display area of the lower substrate.

4. The organic light-emitting display device according to claim 1, further comprising an over-coat layer between the lower substrate and the light-emitting structure,
wherein the over-coat layer includes an organic material, and the over-coat layer extends between the non-display area of the lower substrate and the second region of the bank insulating layer.

5. The organic light-emitting display device according to claim 4, a side surface of the over-coat layer toward a side surface of the lower substrate is vertically aligned with a side surface of the encapsulating layer.

6. An organic light-emitting display device, comprising:
a lower substrate including a display area and a non-display area disposed outside the display area, the non-display area including a side surface of the lower substrate;
an upper substrate on the display area and the non-display area of the lower substrate;

an encapsulating layer between the lower substrate and the upper substrate, the encapsulating layer including a moisture-absorbing material;

a first organic insulating layer between the lower substrate and the encapsulating layer, the first organic insulating layer including an organic material;

a second organic insulating layer between the display area of the lower substrate and the first organic insulating layer, the second organic insulating layer being extended between the non-display area of the lower substrate and the first organic insulating layer;

a light-emitting structure between the first organic insulating layer and the second organic insulating layer, the light-emitting structure overlapping with the display area of the lower substrate; and an upper protecting layer between the first organic insulating layer and the encapsulating layer, the upper protecting layer including an inorganic material, wherein the light-emitting structure includes a lower light-emitting electrode, a light-emitting layer and an upper light-emitting electrode, which are sequentially stacked, wherein the second organic insulating layer covers an edge of the lower light-emitting electrode, wherein the second organic insulating layer includes an organic material differing from that of the first organic insulating layer, and wherein a side surface of the upper protecting layer toward a side surface of the lower substrate is disposed on the display area of the lower substrate.

7. The organic light-emitting display device according to claim 6, wherein the encapsulating layer is in contact with the first organic insulating layer on the non-display area of the lower substrate.

8. The organic light-emitting display device according to claim 6, wherein a side surface of the second organic insulating layer is continuous with a side surface of the first organic insulating layer on the non-display area of the lower substrate.

9. The organic light-emitting display device according to claim 6, the first organic insulating layer is in contact with an upper surface of the second organic insulating layer facing the upper substrate on the non-display area of the lower substrate.

10. The organic light-emitting display device according to claim 6, further comprising a third organic insulating layer between the lower substrate and the light-emitting structure,
wherein the third organic insulating layer includes an organic material, and
wherein the third organic insulating layer extends between the non-display area of the lower substrate and the second organic insulating layer.

11. The organic light-emitting display device according to claim 10, wherein the organic material of the third organic insulating layer is different from that of the second organic insulating layer.

12. The organic light-emitting display device according to claim 10, wherein a side surface of the third organic insulating layer is continuous with a side surface of the second organic insulating layer on the non-display area of the lower substrate.

13. An organic light-emitting display device comprising:
an upper substrate on a lower substrate;
a light-emitting structure between the lower substrate and the upper substrate, the light-emitting structure including a lower light-emitting electrode, a light-emitting layer and an upper light-emitting electrode, which are sequentially stacked;
an upper protecting layer between the light-emitting layer and the upper substrate, the upper protecting layer including an inorganic material;
an over-coat layer between the lower substrate and the light-emitting structure, the over-coat layer extending outside the upper protecting layer; and
an encapsulating layer between the upper protecting layer and the upper substrate, the encapsulating layer being in contact with the over-coat layer in the outside of the upper protecting layer,
wherein the encapsulating layer includes a moisture-absorbing material.

14. The organic light-emitting display device according to claim 13, further comprising a bank insulating layer covering an edge of the lower light-emitting electrode,
wherein the bank insulating layer extends outside the upper protecting layer, and
wherein a side surface of the bank insulating layer is disposed between a side surface of the over-coat layer and a side surface of the upper protecting layer in the outside of the upper protecting layer.

15. The organic light-emitting display device according to claim 14, wherein the encapsulating layer is in contact with the side surface of the over-coat layer in the outside of the upper protecting layer.

16. The organic light-emitting display device according to claim 14, further comprising a capping layer between the light-emitting structure and the upper protecting layer,
wherein the capping layer extends outside the upper protecting layer, and
wherein the capping layer is in contact with the encapsulating layer in the outside of the upper protecting layer.

17. The organic light-emitting display device according to claim 16, wherein a side surface of the bank insulating layer is disposed between a side surface of the over-coat layer and a side surface of the capping layer in the outside of the upper protecting layer.

* * * * *